US006703188B1

(12) United States Patent
Kagami et al.

(10) Patent No.: US 6,703,188 B1
(45) Date of Patent: Mar. 9, 2004

(54) METHOD OF FABRICATING OPTICAL WAVEGUIDE STRUCTURE

(75) Inventors: Manabu Kagami, Aichi-ken (JP); Tatsuya Yamashita, Aichi-ken (JP); Hiroshi Ito, Aichi-ken (JP); Yasuhiko Takeda, Aichi-ken (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 09/534,458

(22) Filed: Mar. 27, 2000

(30) Foreign Application Priority Data

Mar. 29, 1999 (JP) .......................................... 11-085203

(51) Int. Cl.⁷ ................................................. G02B 6/10
(52) U.S. Cl. ...................... 430/321; 430/394; 430/290; 385/123; 385/124; 385/143; 385/145
(58) Field of Search ................................ 430/321, 394, 430/298; 385/124, 123, 143, 145

(56) References Cited

U.S. PATENT DOCUMENTS

| 3,993,485 | A | * | 11/1976 | Chandross et al. | ......... | 430/290 |
| 4,125,644 | A | * | 11/1978 | Ketley et al. | ................. | 427/36 |
| 4,712,854 | A | * | 12/1987 | Mikami et al. | .......... | 350/96.12 |
| 4,801,477 | A | * | 1/1989 | Fudim | ........................ | 430/321 |
| 4,883,743 | A | * | 11/1989 | Booth et al. | ................. | 430/321 |
| 5,054,872 | A | * | 10/1991 | Fan et al. | .................... | 385/130 |
| 5,911,025 | A | * | 6/1999 | Garito et al. | ................ | 385/124 |
| 6,023,545 | A | * | 2/2000 | Eldada et al. | ................. | 385/37 |
| 6,306,563 | B1 | * | 10/2001 | Xu et al. | ..................... | 430/321 |

FOREIGN PATENT DOCUMENTS

| JP | 57-128301 | | 8/1982 |
| JP | 59-223408 | * | 12/1984 |
| JP | 60-247515 | * | 12/1985 |
| JP | 04-165311 | | 6/1992 |
| JP | 06-045506 | * | 2/1994 |
| JP | 10-221547 | | 8/1998 |

OTHER PUBLICATIONS

S. J. Frisken, "Light–induced Optical Waveguide Uptapers," Optics Letters, vol. 18, No. 13, (Jul. 1, 1993), pp. 1035–1037.

Office action from Japanese patent office.

* cited by examiner

*Primary Examiner*—Martin Angebranndt
(74) *Attorney, Agent, or Firm*—Oblon, Spivak, McClelland, Maier & Neustadt, P.C.

(57) ABSTRACT

A method of fabricating an optical waveguide structure includes the step of introducing light into a photo-curable liquid resin. The liquid resin can be a mixture of two types of photo-curable liquid resins having different curing initiation wavelengths and different refractive indexes. The method can include dipping one end of a fiber into the liquid mixture. Light having a wavelength $\lambda_1$ can be radiated from the tip end of the optical fiber in order to cure one of the photo-curable liquid resins thereby forming a waveguide. Light having a different wavelength $\lambda_2$ can be radiated from an area surrounding the waveguide so as to cure the liquid mixture and form a cladding portion around the waveguide.

22 Claims, 8 Drawing Sheets

METHOD OF FABRICATING OPTICAL WAVEGUIDE STRUCTURE

BACKGROUND OF THE INVENTION

1. Field of the Invention

The present invention relates to a method of fabricating an optical waveguide structure by use of light and a photo-curable liquid resin. More particularly, the present invention relates to a method of fabricating an optical waveguide structure by use of light and a mixture of two types of photo-curable liquid resins having different curing initiation wavelengths and different refractive indexes, in which the core portion of the optical waveguide structure is formed through curing of one photo-curable liquid resin, and the cladding portion of the optical waveguide structure is formed through curing of both the photo-curable liquid resins.

The present invention further relates to a method of fabricating an optical waveguide structure in which an optical fiber is dipped into the above-described liquid mixture in order to form an optical waveguide structure which continues from the optical fiber and is excellent in terms of straightness and parallelism.

The present invention is applicable to optical connectors for interconnection, optical splitters, and optical mixers which are used in optical communications and which are inexpensive and involve lowered loss.

2. Description of the Related Art

Recently, there has been widely noticed a technique for forming an optical waveguide at a tip end of an optical fiber by use of a photo-curable liquid resin. Japanese Patent Application Laid-Open No. 4-165311 discloses an exemplary method for fabricating an optical waveguide structure. Briefly, in a first step, one end of an optical fiber is dipped into a photo-curable liquid resin containing fluorine-based monomers. In a subsequent step (second step), light having a wavelength suitable for curing the liquid resin is radiated from the tip end of the fiber.

When a laser beam having, for example, a wavelength close to a UV range or a shorter wavelength is caused to radiate from the tip end of the optical fiber, a portion of the photo-curable liquid resin adjacent to the tip end cures through photopolymerization. Thus, a so-called core portion is formed at the tip end of the fiber in accordance with the power distribution of the laser beam. The formation of the core portion enables the laser beam to propagate farther, so that the core portion is extended. As a result, an optical waveguide is formed.

In a third step, the optical fiber is removed from the photo-curable liquid resin and is subjected to cleaning or a like process in order to remove a portion of the photo-curable liquid resin which remains in an uncured state. Subsequently, in a fourth step, the core portion is coated with light-transmissive resin in order to protect the core portion from dust and prevent damage to the core portion. In a final, fifth step, the tip end surface of the thus-formed core portion is ground in order to form a light output surface of the waveguide.

As described above, an optical waveguide continuous from an optical fiber is formed in five steps.

However, when such an optical waveguide is formed by the conventional method, a resultant optical waveguide meanders, while the cross-sectional area of the path increases gradually. The term "meander" means that the radius periodically changes along a Z-axis or optical axis. This phemomenon occurs due to mismatch in refractive index between the core portion of the optical fiber and a photo-curable liquid resin. As a result, there is formed a graded-index-type optical waveguide having an widened beam aperture.

In such a graded-index-type optical waveguide, light meanders in accordance with refractive index. That is, the focal distance changes depending on the length of the waveguide. Therefore, in the final step for grinding the end surface, the grinding amount must be determined while the focal distance is measured. This results in an extremely high fabrication cost.

In addition, the waveguide length of the core portion formed by the conventional method is limited to 8.5 mm. When end surface treatment is performed, the waveguide length decreases further. Therefore, such a conventional method is difficult to apply to cases in which a split mirror is inserted in a waveguide in order to fabricate an optical splitter or combiner, although it can be applied to connectors for connecting optical fibers.

There has also been reported that a tapered optical waveguide is formed at the tip end of an optical fiber. Formation of such a tapered optical waveguide also stems from mismatch in refractive index between the core portion of the optical fiber and a photo-curable liquid resin. When such a tapered optical waveguide is used in an optical combiner or splitter, its loss increases due to an increase in cross-sectional area.

Further, the above-described method has a drawback in that if the cladding layer is cured as is, the refractive index of the cladding layer becomes the same as that of the core portion. Accordingly, in order to obtain a step-index-type optical waveguide, an additional step for replacing the material for fabricating the cladding portion with any other material is required, resulting in deterioration in productivity.

SUMMARY OF THE INVENTION

The present invention was accomplished in order to solve the above-described problems, and an object of the present invention is to provide a method of fabricating an optical waveguide structure which facilitates formation of core and cladding portions by use of a liquid mixture of two types of photo-curable liquid resins and which enables the core portion to extend straight. The term of "a liquid mixture of two types of photo-curable liquid resins" herein means that the liquid mixture should contain a plurality of photo-curable liquid resins which are not identical in curing initiation wavelength and refractive index, as hereinafter described. Hence, the photo-curable liquid resins to be used are not necessarily of two kinds.

Another object of the present invention is to provide a method of fabricating an optical waveguide structure in which the refractive index of the liquid mixture is adjusted in accordance with an optical fiber to be used to thereby enable formation of an optical waveguide which extends straight from a light output end of an optical fiber, regardless of the type of the optical fiber.

Still another object of the present invention is to provide a method of fabricating an optical waveguide structure which can greatly reduce assembly cost and parts cost in order to render the optical waveguide structure inexpensive.

In order to achieve the above objects, according to a first aspect of the present invention, there is provided a method of fabricating an optical waveguide structure in which light of a predetermined wavelength is introduced into a photo-curable liquid resin in order to cure the photo-curable liquid resin along an optical axis to thereby form an optical waveguide structure continuing from an area through which the light is introduced. The photo-curable liquid resin is a liquid mixture of a first photo-curable liquid resin and a second photo-curable liquid resin having a curing initiation wavelength shorter than that of the first photo-curable liquid resin. A light beam of a wavelength capable of curing only the first photo-curable liquid resin is radiated into the liquid mixture so as to form a core portion having a rod-like shape. Subsequently, light of a wavelength capable of curing both the first and second photo-curable liquid resins is radiated into the liquid mixture from an area surrounding the liquid mixture so as to form a hardened cladding portion surrounding the core portion. The core portion has a refractive index greater than that of the cladding portion.

In the fabrication method according to a second aspect of the present invention, the refractive index of the first photo-curable liquid resin after curing is greater than the refractive index of the liquid mixture.

In the fabrication method according to a third aspect of the present invention, the beam of light having the predetermined wavelength is radiated from a tip end of an optical fiber dipped into the liquid mixture, and the optical waveguide structure is formed so as to be continuous from the tip end of the optical fiber.

In the fabrication method according to a fourth aspect of the present invention, the optical fiber is a step-index-type optical fiber whose refractive index changes stepwise at the boundary between the core portion and the cladding portion. In this case, the refractive index $n_{C1}$ of the liquid mixture is adjusted so as to satisfy the following conditional equation (5):

$$n_{f1}^2 - n_{f2}^2 \leq n_{A2}^2 - n_{C1}^2 \quad (5)$$

where $n_{f1}$ is the refractive index of the core portion of the optical fiber, $n_{f2}$ is the refractive index of the cladding portion of the optical fiber, and $n_{A2}$ is the refractive index of the core portion of the optical waveguide structure.

In the fabrication method according to a fifth aspect of the present invention, the optical fiber is a graded-index-type optical fiber whose refractive index is graded in the radial direction in accordance with a predetermined function. In this case, the refractive index $n_{C1}$ of the liquid mixture is adjusted such that the diameter $2a_W$ of the core portion of the formed optical waveguide structure satisfies the following conditional equation (6):

$$2a_W = 2a_f [1/(2\Delta) \cdot (n_{A2}^2 - n_{c1}^2)/n_{A2}^2]^{1/p} \quad (6)$$

where $\Delta = (n_{f1}^2 - n_{f2}^2)/(2n_{f1}^2)$, $n_{f1}$ is the maximum refractive index of the core portion of the optical fiber, i.e., refractive index of the center of the core, $2a_f$ is the diameter of the core portion, $n_{f2}$ is the refractive index of the cladding portion of the optical fiber, $n_{A2}$ is the refractive index of the core portion of the optical waveguide structure, and p is an integer.

According to sixth and seventh aspects of the present invention, there is provided a method of fabricating an optical waveguide structure in which a tip end of an optical fiber is dipped into a photo-curable liquid resin, and light of a predetermined wavelength is radiated from the tip end in order to cure the photo-curable liquid resin along an optical axis to thereby form an optical waveguide continuing from the tip end of the optical fiber. In the fabrication method according to the sixth aspect, the optical fiber is a step-index-type optical fiber whose refractive index changes stepwise at the boundary between the core portion and the cladding portion; and the refractive index $n_{C1}$ of the photo-curable liquid resin is adjusted so as to satisfy the following conditional equation (7):

$$n_{f1}^2 - n_{f2}^2 \leq n_{A2}^2 - n_{C1}^2 \quad (7)$$

where $n_{f1}$ is the refractive index of the core portion of the optical fiber, $n_{f2}$ is the refractive index of the cladding portion of the optical fiber, and $n_{A2}$ is the refractive index of the formed optical wave guide structure.

In the fabrication method according to the seventh aspect, the optical fiber is a graded-index-type optical fiber whose refractive index is graded in the radial direction in accordance with a predetermined function; and the refractive index $n_{C1}$ of the photo-curable liquid resin is adjusted such that the diameter $2a_W$ of the formed optical waveguide structure satisfies the following conditional equation (8):

$$2a_w = 2a_f [1/(2\Delta) \cdot (n_{A2}^2 - n_{c1}^2)/n_{A2}^2]^{1/p} \quad (8)$$

where $\Delta = (n_{f1}^2 - n_{f2}^2)/(2n_{f1}^2)$, $n_{f1}$ is the maximum refractive index of the core portion of the optical fiber, i.e., refractive index of the center of the core, $2a_f$ is the diameter of the core portion, $n_{f2}$ is the refractive index of the cladding portion of the optical fiber, $n_{A2}$ is the refractive index of the formed optical waveguide structure, and p is an integer.

The method of fabricating an optical waveguide structure according to the first aspect of the present invention utilizes a liquid mixture of two types of photo-curable liquid resins; i.e., a liquid mixture of a first photo-curable liquid resin and a second photo-curable liquid resin having a curing initiation wavelength shorter than that of the first photo-curable liquid resin. The refractive index of the first photo-curable liquid resin after curing is set greater than the refractive index of the liquid mixture after curing. The liquid mixture is placed in, for example, a transparent container having the shape of a rectangular parallelepiped.

A beam of light having a wavelength $\lambda_W$ ($\lambda_2 < \lambda_W < \lambda_1$) capable of curing only the first photo-curable liquid resin is radiated into the liquid mixture, where $\lambda_1$ is the curing initiation wavelength of the first photo-curable liquid resin, and $\lambda_2$ is the curing initiation wavelength of the second photo-curable liquid resin. The wavelength at which each photo-curable liquid resins starts curing is smaller than the curing initiation wavelength of each resins. The beam of light having the wavelength $\lambda_W$ may be generated by use of, for example, a short-wavelength laser such as a He-Cd laser.

As result, only the first photo-curable liquid resin of the liquid mixture cures through photopolymerization, thereby forming a straight core portion. At this time, the liquid mixture of two types of photo-curable liquid resins remains around the circumferential surface of the core portion.

Subsequently, light having a wavelength $\lambda_C$ ($\lambda_C < \lambda_2$) capable of curing both the first and second photo-curable liquid resins is radiated into the liquid mixture from an area surrounding the liquid mixture, by use of, for example, a UV lamp. As a result, the remaining liquid solidifies through photopolymerization, so that a cladding portion is formed around the core portion.

Through the above-described setting of the refractive index of the liquid mixture, the refractive index of the core portion becomes greater than that of the cladding portion. That is, a step-index-type optical waveguide structure is formed.

As described above, a step-index-type optical waveguide structure having core and cladding portions is formed through irradiation of light in two steps. Accordingly, the fabrication method is considerably efficient.

The transparent container for accommodating the liquid mixture may have an arbitrary shape. This enables the cladding portion to be formed into an arbitrary shape in accordance with, for example, the shape of a target product or component. That is, the cladding portion can be fixed directly to a product or component. Accordingly, the optical waveguide structure fabricated by the present method is very convenient.

Since the optical waveguide structure is integrally fabricated through irradiation of a light beam having a wavelength $\lambda_W$ and light having a wavelength $\lambda_C$, the optical waveguide structure can be fabricated at low cost.

As described in Japanese Patent Application No. 10-152157, the above-described steps may be performed after an optical element such as a half mirror is placed in the above-described container in order to fabricate an optical splitter in which an optical waveguide is integrated with the half mirror.

It has been known that when the optical waveguide structure is deformed, the phase of a light wave changes. Since the above-described fabrication method enables formation of the cladding portion into an arbitrary shape, a physical phenomenon such as stress, an electric field, a magnetic field, or an ultrasonic wave can be applied to the optical waveguide structure with ease.

Therefore, stress can be easily applied to the optical waveguide structure in various manners; i.e., the phase of a light wave can be easily changed in various manners. Accordingly, an optical element such as a phase-modulation element can be formed.

That is, the above-described fabrication method serves as a fundamental technique for forming fundamental structures of a various types of optical elements having optical waveguides.

In the fabrication method according to the second aspect of the present invention, the refractive index of the first photo-curable liquid resin after curing is rendered greater than the refractive index of the liquid mixture. That is, upon irradiation of the light of the wavelength $\lambda_1$, the first photo-curable liquid resin hardens, so that the refractive index of the first photo-curable liquid resin becomes higher than the refractive index of the liquid mixture. Thus, a step-index-type optical waveguide is formed in the liquid mixture.

Since the formed waveguide is of the step-index-type, the incident light causes total reflection, so that the waveguide is extended efficiently. Therefore, the light radiated into the liquid mixture is not limited to a laser beam which propagates straight. For example, a UV beam may be used. In this case, the UV beam is radiated into the liquid mixture at an angle which causes total reflection. Therefore, in the fabrication method of the second aspect, any of various types of light sources may be used.

In the fabrication method according to the third aspect of the present invention, a tip end of an optical fiber is dipped into the liquid mixture, and a beam of light having the predetermined wavelength is radiated from the tip end of the optical fiber. The beam of light having the predetermined wavelength may be a short-wavelength laser beam.

The short-wavelength laser beam causes the first photo-curable liquid resin to cure along the optical axis through photopolymerization. Thus, the core portion of the optical waveguide structure is formed straight such that the core portion maintains close contact with the core portion of the optical fiber and is continuous therefrom. Therefore, it becomes unnecessary to align the optical axis of the optical waveguide structure and that of the optical fiber.

Further, the tip end of the optical fiber is firmly fixed with the cladding portion of the optical waveguide structure through irradiation of light having the above described wavelength $\lambda_C$. Accordingly, the optical waveguide structure can be disposed with a high degree of freedom and can be handled with ease. Accordingly, the optical waveguide structure is highly convenient.

In the fabrication method according to the fourth aspect of the present invention, the optical fiber is a step-index-type optical fiber whose refractive index changes stepwise at the boundary between the core portion and the cladding portion; and the refractive index $n_{f1}$ of the center of the core portion of the optical fiber, the refractive index $n_{f2}$ of the cladding portion of the optical fiber, the refractive index $n_{A2}$ of the core portion of the optical waveguide structure, and the refractive index $n_{C1}$ of the liquid mixture satisfy conditional equation (5).

This condition equation represents conditions under which all light which has propagated within the step-index-type optical fiber while causing total reflection causes refraction at the boundary between the core portion of the optical fiber and the core portion of the optical waveguide structure, and the refracted light propagates within the core portion of the optical waveguide structure while causing total reflection.

The refractive index of the liquid mixture is adjusted so as to satisfy condition equation (5). The optical waveguide structure may be formed even when condition equation (5) is not satisfied. In this case, however, the shape of the optical waveguide structure becomes nonuniform, and transmission loss due to leakage of light increases. When condition equation (5) is satisfied, all light having propagated through the optical fiber is refracted at the above-described boundary and propagates within the core portion of the optical waveguide structure while causing total reflection.

The total reflection of light within the core portion of the optical waveguide structure enables continuous formation of the core portion. That is, the core portion of the step-index-type optical fiber is extended straight in order to form the optical waveguide structure. Thus, there is fabricated a straight optical waveguide structure connected directly to the tip end of the step-index-type optical fiber.

In the fabrication method according to the fifth aspect of the present invention, the optical fiber is a graded-index-type optical fiber whose refractive index is graded in the radial direction in accordance with a predetermined function; and the refractive index $n_{f1}$ of the core portion of the optical fiber, the diameter $2a_f$ of the core portion, the refractive index $n_{f2}$ of the cladding portion of the optical fiber, the refractive index $n_{A2}$ of the core portion of the optical waveguide structure, the refractive index $n_{C1}$ of the liquid mixture, and the diameter $2a_W$ of the core portion of the formed optical waveguide structure satisfy the above-described conditional equation (6). In equation (6), p is an integer.

Equation (6) indicates that the diameter $2a_f$ of the core portion of the optical waveguide structure can be controlled by means of proper selection of the refractive index $n_{C1}$ of the liquid mixture. The refractive index $n_{C1}$ of the liquid mixture can be adjusted through adjustment of the mixing ratio between the two types of photo-curable liquid resins.

The refractive index $n_{C1}$ of the liquid mixture is selected to satisfy equation (6). Therefore, light which has propagated straight in the vicinity of the optical axis of the optical fiber while being subjected to refraction is extracted though a reduced light output surface. The thus-extracted light propagates straight, so that a step-index-type optical waveguide structure is formed in the liquid mixture. Accordingly, the fabrication method of the present aspect can be applied to a graded-index-type optical fiber used for high-speed communications.

In the fabrication method according to the sixth aspect, a tip end of a step-index-type optical fiber is dipped into a photo-curable liquid resin, and light of a predetermined wavelength is radiated from the tip end of the optical fiber. The light of a predetermined wavelength may be a short-wavelength laser beam. The short-wavelength light continuously causes photopolymerization of the photo-curable liquid resin along the optical axis.

Thus, a rod-shaped optical waveguide (core portion) is formed such that the optical waveguide maintains close contact with the core portion of the optical fiber and is continuous therefrom. There, in this case as well, alignment between the optical axis of the optical fiber and the optical axis of the optical waveguide is not required.

The first to fifth aspects of the present invention are characterized in that core and cladding portions of an optical waveguide structure are formed through irradiation of light in two steps, and the core and cladding portions are generally referred to as an "optical waveguide structure." In contrast, the sixth and seventh aspects of the present invention are characterized in that a straight optical waveguide structure (including a core portion only) is formed. by use of a single type of a photo-curable liquid resin. Therefore, in the sixth and seventh aspects, the term "optical waveguide structure" has the same meaning as that of the term "core portion."

In the above-described fabrication method, the refractive index $n_{f1}$ of the core portion of a step-index-type optical fiber, the refractive index $n_{f2}$ of the cladding portion of the optical fiber, the refractive index $n_{A2}$ of the optical waveguide structure formed in the photo-curable liquid resin, and the refractive index $n_{C1}$ of the photo-curable liquid resin satisfy the above-described conditional equation (7).

This condition equation represents conditions under which all light which has propagated within the step-index-type optical fiber while causing total reflection causes refraction at the boundary between the core portion of the optical fiber and the optical waveguide structure, and the refracted light propagates within the optical waveguide structure while causing total reflection.

The refractive index of the photo-curable liquid resin is adjusted so as to satisfy condition equation (7). Therefore, light having propagated through the optical fiber is transmitted to the optical waveguide structure, so that the light extends the optical waveguide structure while causing total reflection.

That is, according to the fabrication method of the present invention, the core portion of the step-index-type optical fiber is extended straight in order to form the optical waveguide structure, which is excellent in terms of straightness and parallelism.

When a liquid whose refractive index increases after cure and satisfies equation (7) is employed, a single type of photo-curable liquid resin may be used as described above. Further, when, as in the third aspect, the refractive index of one photo-curable liquid resin which is selectively cured in order to form a core portion of the optical waveguide structure is made higher than that of the other photo-curable liquid resin which does not cure during the formation of the core portion, the difference between the refractive index of the core portion after curing and that of the liquid mixture can be made greater, so that the liquid that satisfies equation (7) can be prepared easily. The liquid may be formed of a single type of a photo-curable liquid resin or a plurality of types of photo-curable liquid resins. In this case, the optical waveguide structure is surrounded by an uncured photo-curable liquid resin (liquid). In actual practice, any type of medium may exist around the optical waveguide structure. For example, gas, another liquid, or a solid material may exist around the optical waveguide structure, insofar as the selected medium has a refractive index lower than that of the optical waveguide structure.

For example, before use, the optical waveguide structure is removed from the photo-curable liquid resin and is cleaned. As a result, the circumference of the optical waveguide structure is surrounded by air serving as a cladding portion, so that the refractive index of the core portion becomes greater than that of the cladding portion. Therefore, total reflection conditions are satisfied, and the optical waveguide structure serves as a step-index-type optical waveguide structure producing a reduced transmission loss. When the core potion is surrounded by liquid, an optical waveguide structure having a liquid cladding portion is obtained. When the core potion is surrounded by a solid material, an optical waveguide structure having a solid cladding portion is obtained.

Further, the above-described optical waveguide structure is flexible and has a rod-like shape. Therefore, the optical waveguide structure can be disposed in direct contact with a light-emitting window of a semiconductor laser element or a light-receiving element having a small light receiving area, wherein the semiconductor laser element and the light-receiving element are formed on a semiconductor substrate. Accordingly, the fabrication method of the present embodiment enables fabrication of an optical waveguide structure convenient for light input and light output.

In the fabrication method according to the seventh aspect, the optical fiber dipped into the photo-curable liquid resin is a graded-index-type optical fiber whose refractive index is graded in the radial direction in accordance with a predetermined function; and the refractive index $n_{f1}$ of the core portion of the optical fiber, the diameter $2a_f$ of the core portion, the refractive index $n_{f2}$ of the cladding portion of the optical fiber, the refractive index $n_{A2}$ of the optical waveguide structure, the refractive index $n_{C1}$ of the photo-curable liquid resin, and the diameter $2a_W$ of the formed optical waveguide structure satisfy the above-described conditional equation (8). In equation (8), p is an integer.

Equation (8) indicates that the diameter $2a_W$ of the optical waveguide structure can be controlled by means of proper selection of the refractive index $n_{C1}$ of the liquid mixture. The refractive index $n_{C1}$ of the liquid mixture can be adjusted through adjustment of the mixing ratio between the two types of photo-curable liquid resins.

The refractive index $n_{C1}$ of the photo-curable liquid resin is selected so as to satisfy equation (8). Therefore, light which has propagated straight in the vicinity of the optical fiber while being subjected to refraction is extracted though a reduced light output area. The thus-extracted light propagates straight, so that a step-index-type optical waveguide structure is formed in the photo-curable liquid resin. Accordingly, the fabrication method of the present aspect can be applied to a graded-index-type optical fiber used for high-speed communications.

In the fabrication method of the seventh aspect as well, the liquid may be formed of a single type of a photo-curable liquid resin or a plurality of types of photo-curable liquid resins.

DESCRIPTION OF THE PREFERRED EMBODIMENTS

Figure 1:
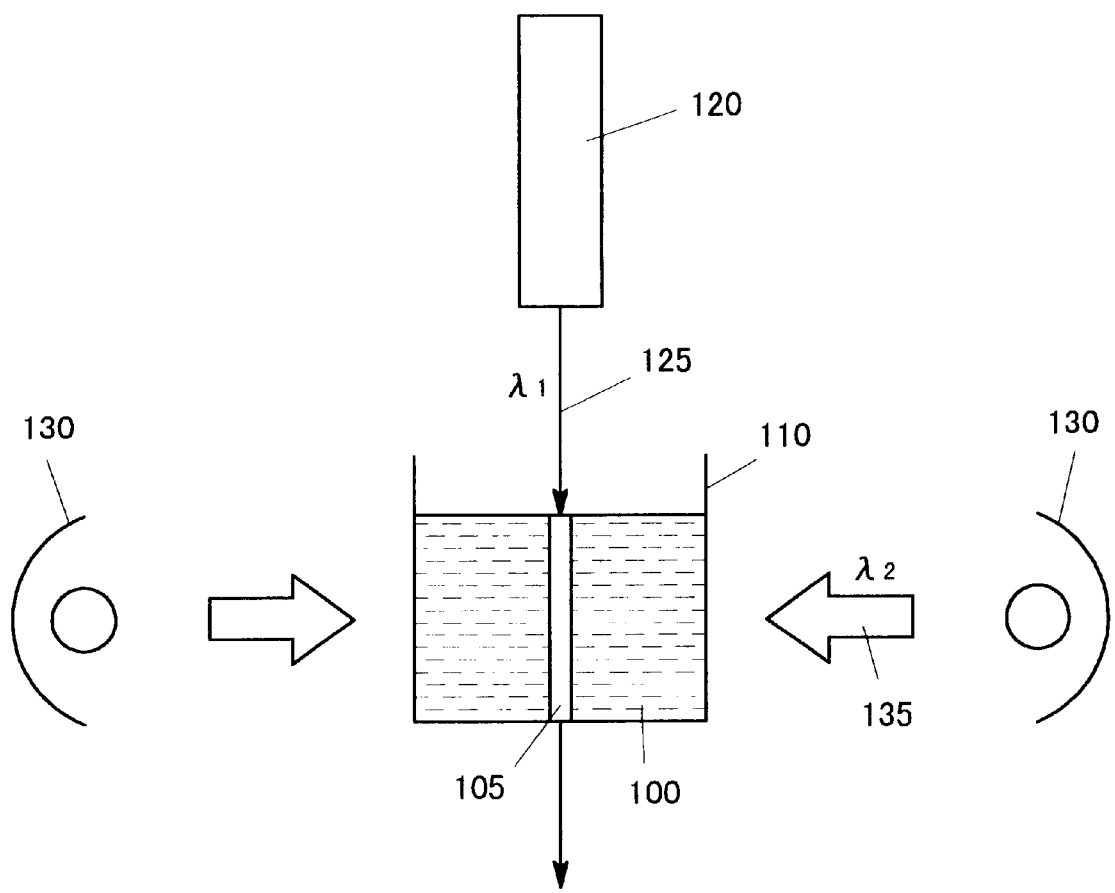
FIG. 1 is a schematic diagram showing a method of fabricating an optical waveguide structure according to a first embodiment.

The present invention will now be described by way of specific embodiments; however, the present invention is not limited to the embodiments.

First Embodiment

A method of fabricating an optical waveguide structure according to the present invention will be described with reference to FIG. 1, which schematically shows a fabrication apparatus. The fabrication method is a so-called optical forming method which uses an apparatus having no movable members and utilizes a photo-curable liquid resin, which is liquid monomer, and a short-wavelength laser for curing the resin.

Specifically, the fabrication method according to the present invention uses a liquid mixture 100 of two types of photo-curable liquid resins having different curing initiation wavelengths and different refractive indexes after curing; a transparent container 110 which holds the liquid mixture 100; a short-wavelength, laser 120 which cures one component of the liquid mixture along a straight line; and a UV lamp 130 which cures the entirety of the liquid mixture 100.

An optical waveguide structure is formed to include a core portion 105 formed straight and a cladding portion formed around the core portion 105 through curing of the entirety of the liquid mixture 100.

The present invention is characterized in that two types of photo-curable liquid resins having different initiation start wavelengths and different refractive indexes after curing are mixed, and the thus-obtained liquid mixture is used as a photo-curable liquid resin for an optical forming method.

The present invention is further characterized in that a so-called step-index-type optical waveguide structure whose core portion has a refractive index higher than that of a cladding portion is fabricated through irradiation of two types of light of different wavelength bands in two steps. Therefore, first, a method of preparing the above-described liquid mixture will be described, and then, a method of fabricating an optical waveguide structure by use of the liquid mixture will be described.

Figure 2:
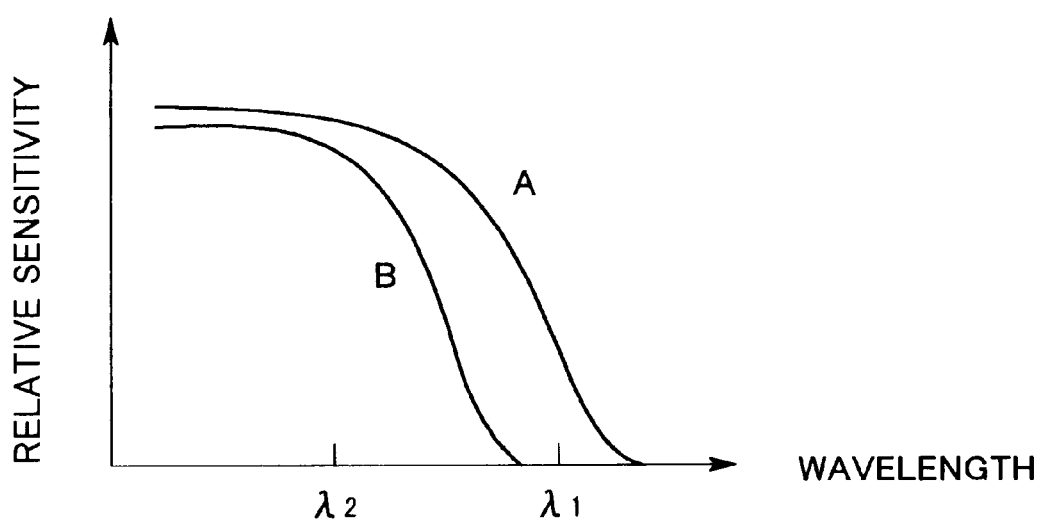
FIG. 2 is a graph showing spectral sensitivity of a liquid mixture used in the first embodiment.

The liquid mixture is composed of an epoxy photo-curable liquid resin having a higher refractive index (e.g., 1.49) and an acrylic photo-curable liquid resin having a lower refractive index (e.g., 1.34). FIG. 2 shows the spectral sensitivities of these photo-curable liquid resins. In FIG. 2, the horizontal axis represents wavelength, and the vertical axis represents relative sensitivity. Curve A represents the spectral sensitivity of the epoxy photo-curable liquid resin, and curve B represents the spectral sensitivity of the acrylic photo-curable liquid resin.

As shown in FIG. 2, the epoxy photo-curable liquid resin and the acrylic photo-curable liquid resin are selected such that the wavelength $\lambda_1$ of the short-wavelength laser 120 used for curing is sandwiched between the curing initiation wavelength of the epoxy photo-curable liquid resin and the curing initiation wavelength of the acrylic photo-curable liquid resin. Hereinafter, the epoxy photo-curable liquid resin having a higher refractive index will be referred to as "liquid A," the acrylic photo-curable liquid resin having a lower refractive index will be referred to as "liquid B."

In general, when liquids A and B having different refractive indexes are mixed, the resultant mixture has a refractive index. $n_{c1}$ represented by the following equation (9) (Yamaguchi, "Refractive Index," Kyoritsu Shuppan (1981)):

$$n_{c1} = [(2M(C_A)+1)/(1-M(C_A))]^{1/2} M(C_A) = C_A(\rho/\rho_A)(n_{A1}^2-1)/(n_{A1}^2+2) \\ + (1-C_A)(\rho/\rho_B)(n_{B1}^2-1)/(n_{B1}^2+2) \qquad (9)$$

where $\rho$: density of the liquid mixture, $\rho_A$: density of liquid A, $\rho_B$: density of liquid B, $n_{A1}$: refractive index of liquid A, $n_{B1}$: refractive index of liquid B, and $C_A$: content (wt. %) of liquid A.

That is, when a photo-curable liquid resin having a higher refractive index $n_{A1}$ and a photo-curable liquid resin having a lower refractive index $n_{B1}$ are mixed at a certain ratio, a liquid mixture 100 having a refractive index $n_{c1}$ ($n_{B1} < n_{c1} < n_{A1}$) is obtained. The refractive index $n_{c1}$ of the liquid mixture 100 is univocally determined through selection of values for the above-described parameters $\rho$ to $C_A$. The refractive index $n_{c2}$ after curing falls between $n_{B2}$ and $n_{A2}$ (i.e., ($n_{B2} < n_{c2} < n_{A2}$)), where $n_{A2}$ represents the refractive index of liquid A after curing, and $n_{B2}$ represents the refractive index of liquid B after curing.

The optical waveguide structure is fabricated by use of the thus prepared liquid mixture 100. Next, the fabrication process will be described. First, the liquid mixture 100 is placed in the transparent container 110 such that the transparent container 110 is filled with the liquid mixture 100. Subsequently, the short-wavelength laser 120 is operated to vertically radiate a laser beam 125 toward the center of the transparent container 110. The short-wavelength laser 120 is a He—Cd (helium-cadmium) laser having a wavelength $\lambda_1$ of, for example 325 nm.

The wavelength $\lambda_1$ is shorter than the curing initiation wavelength of liquid A and longer than the curing initiation wavelength of liquid B. The laser beam 125 propagates straight. Therefore, a straight core portion 105 is formed in the liquid mixture 100. At this time, liquid B on the optical axis is moved to the peripheral portion.

After formation of the core portion 105, the UV lamp 130 is turned on in order to uniformly radiate UV light 135 having a wavelength $\lambda_2$ from the outside of the container 110. The wavelength $\lambda_2$ is shorter than both of the curing initiation wavelengths of liquid A and B. Accordingly, liquids A and B are both cured. As a result, the entirety of the liquid mixture 100 surrounding the core portion 105 is cured, so that a cladding portion is formed.

When the refractive index of the cladding portion before cute is represented by $n_{C1}$ and the refractive index of the cladding portion after curing is represented by $n_{C2}$, the refractive index $n_{A2}$ of the core portion 105 after curing satisfies the following relationship:

$$n_{A2} > n_{C2} > n_{C1}. \tag{10}$$

This means that the formed optical waveguide is of a step index type in which the refractive index $n_{A2}$ of the core portion is greater than the refractive index $n_{C2}$ of the cladding portion. Accordingly, a laser beam or light beam which is launched with an angle that satisfies the total reflection conditions, which will be described later, propagates within the core portion 105 of the optical waveguide structure while causing total reflection.

As described above, a step-index-type optical waveguide can be formed easily through use of a mixture of two types of photo-curable liquid resins having different curing initiation wavelengths and different refractive indexes after curing and irradiation of two kinds of light having different wavelengths in two steps.

The shape of the container or the cladding portion may be modified freely in accordance with products to which the fabrication method is to be applied. Therefore, the fabrication method is highly convenient.

Further, the cladding portion may be formed in shapes suitable for various types of actuators, such as a piezoelectric element for generating stress. Thus, it becomes possible to fabricate a fundamental optical element for measuring a variety of physical quantities on the basis of phase difference, as well as a fundamental optical element for measuring a chemical quantity on the basis of the amount of light absorption.

Accordingly, the above-described fabrication method is a fundamental technique for fabricating useful optical elements having optical waveguides.

Second Embodiment

FIGS. 3A–3D show the steps of a fabrication method according to a second embodiment in which an optical waveguide structure is formed by use of a step-index-type optical fiber. The method shown in FIGS. 3A–3D is the same as that shown in FIG. 1 in that light radiation is performed in two steps in order to form core and cladding portions.

However, the method shown in FIGS. 3A–3D differs from that shown in FIG. 1 in that the tip end of a step-index-type optical fiber is dipped into the above-described liquid mixture in order to form an optical waveguide structure integrally with the optical fiber.

Further, the refractive index of the liquid mixture is adjusted in accordance with that of the optical fiber in order to form a straight optical waveguide maintaining close contact with the optical fiber.

Figure 3D:
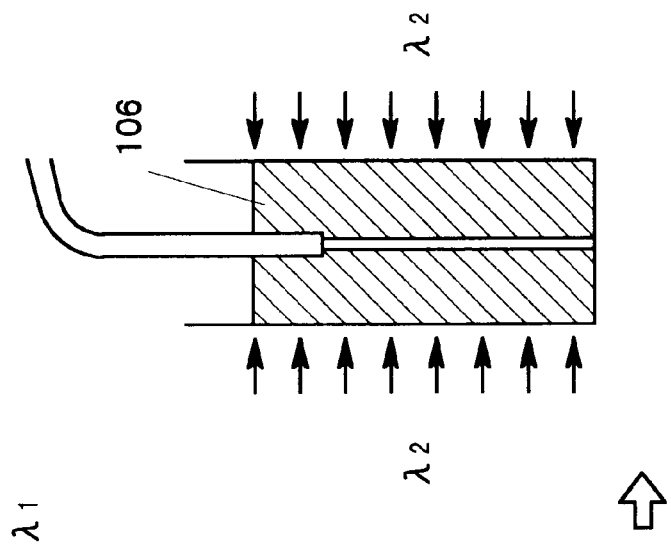
FIGS. 3A–3D are schematic diagrams showing a method of fabricating an optical waveguide structure according to a second embodiment.
Figure 3C:
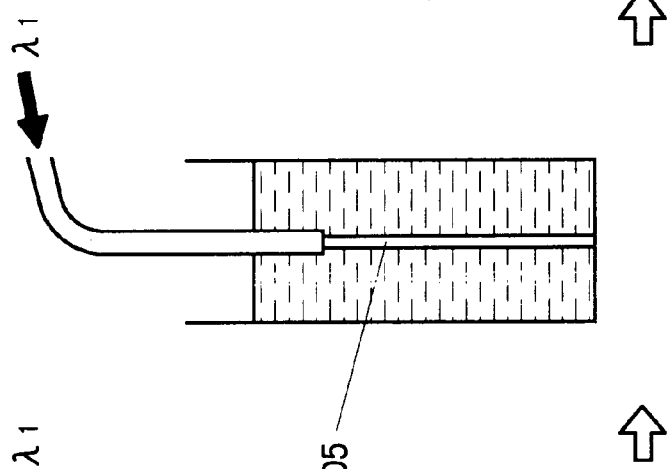
Figure 3B:
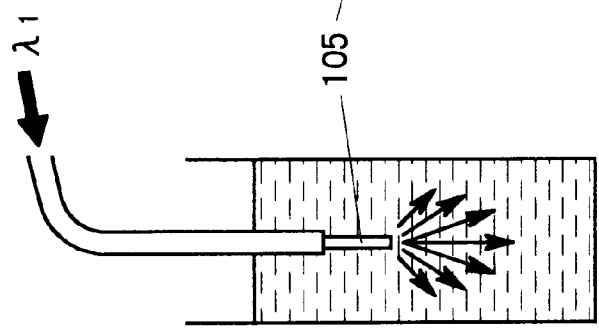
Figure 3A:
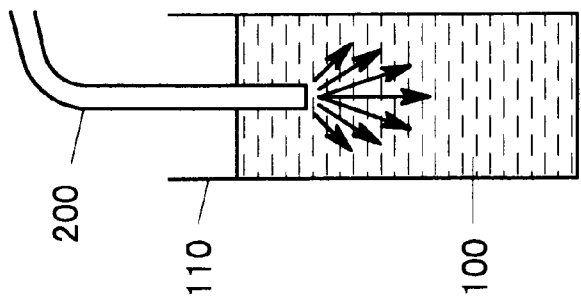

In the first step shown in FIG. 3A, the tip end of a step-index-type optical fiber 200 is dipped into the liquid mixture 100. The refractive index $n_{C1}$ of the liquid mixture 100 is adjusted in advance in accordance with the refractive index of the dipped optical fiber, which will be described later.

In the second step shown in FIG. 3B, short-wavelength light of wavelength $\lambda_1$ is launched into the step-index-type optical fiber 200, so that a core portion 105 is formed at the tip end of the optical fiber 200 in accordance with the same mechanism as that employed in the first embodiment.

In the third step shown in FIG. 3C, the radiation of the light of wavelength $\lambda_1$ is continued until the growing core portion 105 reaches the bottom of the transparent container 110.

In the fourth step shown in FIG. 3D, the radiation of the light of wavelength $\lambda_1$ is stopped. Subsequently, UV light with wavelength $\lambda_2$ is radiated from a UV lamp. Thus, a cladding portion 106 is formed around the core portion 105.

During this step, the tip end of the optical fiber 200 is fixed to the cladding portion 106. Accordingly, there is formed an optical-fiber-integrated-type optical waveguide which does not require optical axis alignment.

Figure 4:
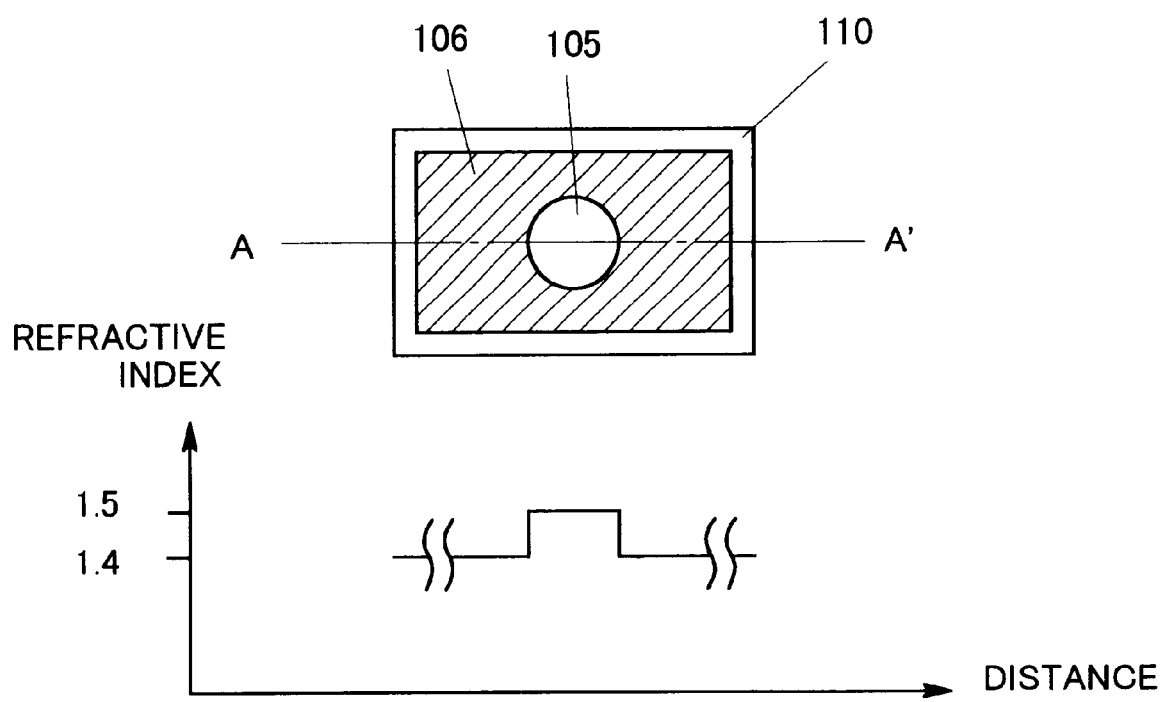
FIG. 4 is a sectional view of an optical waveguide formed by the method according to the second embodiment.

FIG. 4 is a horizontal cross section of the thus-formed optical waveguide structure. The cladding portion is formed around the core portion 105 in accordance with the shape of the transparent container 110. The graph of FIG. 4 represents a refractive index distribution as measured along line A–A'. In the graph, the horizontal axis represents distance, and the vertical axis represents refractive index. The core portion 105 has a constant refractive index $n_{A2}$ (~1.5), and the cladding portion 106 also has a constant refractive index $n_{C2}$ (~1.4). Since $n_{A2} > n_{C2}$ as described above, the formed optical waveguide is of a step-index type, which is the same as that of the dipped optical fiber 200.

The refractive index of the liquid mixture 100 used in the first step is adjusted restrictedly. This is because, depending on the refractive index of the liquid mixture 100, light output from the core portion of the optical fiber 200 disperses, so that a tapered optical waveguide producing a large loss is formed.

Figure 5:
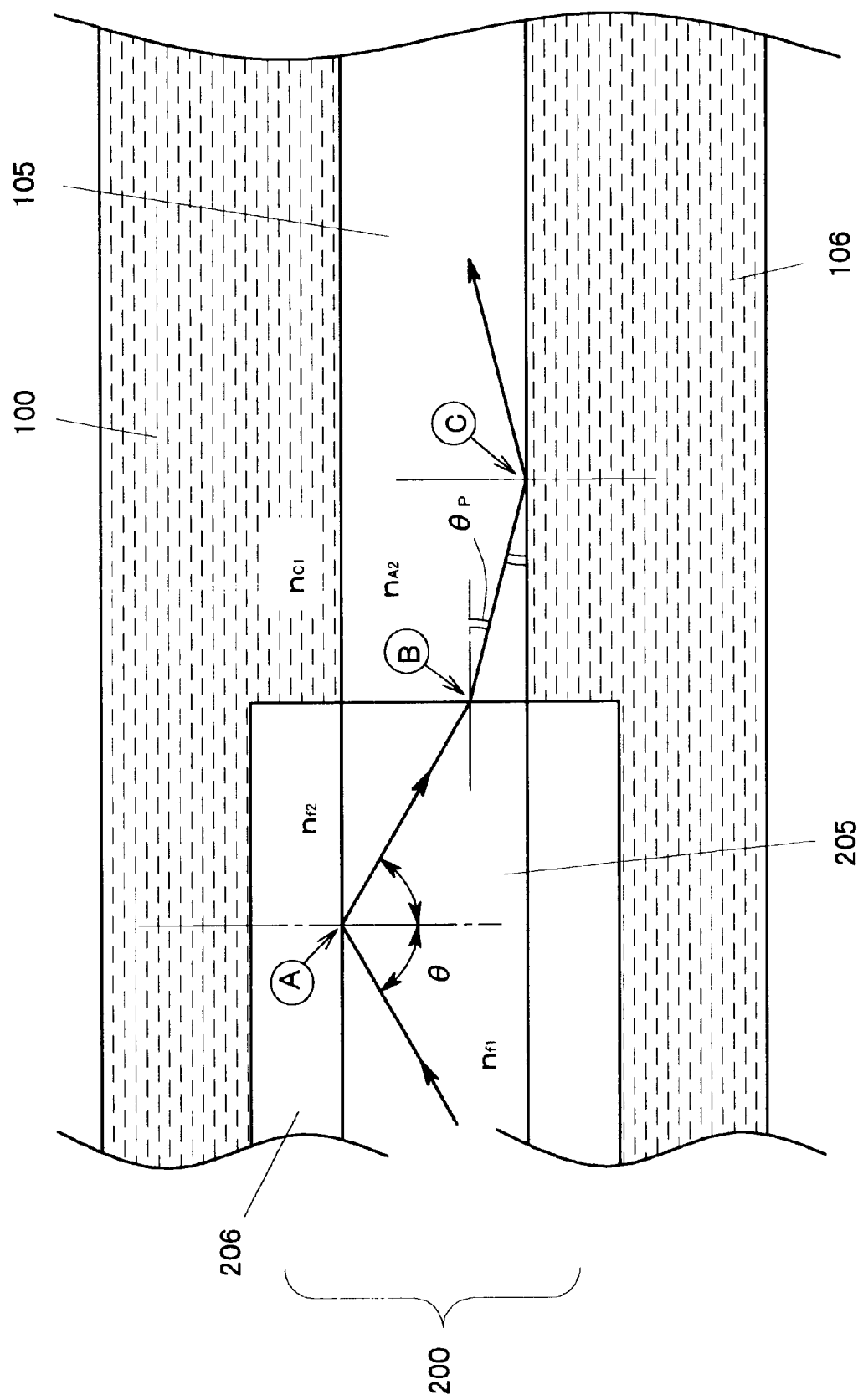
FIG. 5 is a view used for description of transmission conditions in the optical waveguide of the second embodiment.

In view of the foregoing, as shown in FIG. 5, the refractive index $n_{C1}$ of the liquid mixture 100 is adjusted so as to satisfy the requirement described below, in order to prevent dispersion of light at the interface between the core portion 205 of the optical fiber 200 and the core portion 105 of the optical waveguide structure.

Specifically, the refractive index $n_{C1}$ of the liquid mixture 100 is adjusted so as to satisfy equation (11):

$$n_{C1} \leq (n_{A2}^2 - n_{f1}^2 + n_{f2}^2)^{1/2} \tag{11}$$

where $n_{f1}$ is the refractive index of the core portion 205 of the optical fiber dipped into the liquid mixture 100, $n_{f2}$ is the refractive index of the cladding portion 206 of the optical fiber, and $n_{A2}$ is the refractive index of the core portion 105 of the formed optical waveguide structure.

Equation (11) is derived from the conditions under which all light propagating through the optical fiber 200 causes total reflection at the interface between the liquid mixture 100 and the core portion 105 of the formed optical waveguide structure.

More specifically, equation (11) is derived from equation (12) representing total reflection at point A in FIG. 5, equation (13) representing refraction at point B in FIG. 5, and equation (14) representing total reflection at point C in FIG. 5.

$$\sin^{-1}(n_{f2}/n_{f1}) = \theta \tag{12}$$

$$n_{f1} \cdot \sin(\pi/2 - \theta) = n_{A2} \cdot \sin\theta_p \tag{13}$$

$$\sin^{-1}(n_{C1}/n_{A2}) \leq \pi/2 - \theta_p \tag{14}$$

where $\theta$ is a propagation angle, and $\theta_p$ is an angle of refraction corresponding to the propagation angle $\theta$ (see FIG. 5).

when $\theta$ and $\theta_p$ are eliminated from equations (12), (13), and (14), there is obtained equation (11) representing the relationship among the refractive index $n_{C1}$ of the liquid mixture 100, the refractive indexes $n_{f1}$ and $n_{f2}$ of the optical fiber dipped into the liquid mixture 100, and the refractive index $n_{A2}$ of the core portion of the formed optical waveguide structure.

There is a case in which the refractive index $n_{C1}$ of the liquid mixture 100 fails to satisfy equation (11) but satisfies the following equation (15), or in which the core portion 105 and the cladding portion 106 of the optical waveguide structure do not satisfy the requirements for total reflection. In such a case, higher-mode components leak from the core portion 105 to the cladding portion 106. However, within a distance of a few centimeters from the tip end of the optical fiber 200, a substantially straight core portion 105 can be obtained.

$$(n_{A2}^2 - n_{f1}^2 + n_{f2}^2)^{1/2} < n_{C1} < n_{A2} \qquad (15)$$

As described above, in the present embodiment, the refractive index of the liquid mixture 100 is determined in consideration of the refractive index of the optical fiber 200 dipped into the liquid mixture 100. Therefore, light output from the optical fiber propagates straight, so that the core portion 105 of the formed optical waveguide structure has no taper, unlike the conventional optical waveguide structure.

Accordingly, the method of fabricating an optical waveguide according to the present embodiment enables formation of a step-index-type optical waveguide structure whose core portion is grown straight from the tip end (light output end) of the optical fiber such that the core portion extends over a sufficient distance along the optical axis. This enables fabrication of a convenient optical waveguide structure which can be coupled with other optical elements.

Third Embodiment

In the second embodiment, a step-index-type optical waveguide is formed at the tip end of a step-index-type optical fiber 200. In a third embodiment, in place of the step-index-type optical fiber, a graded-index-type optical fiber whose refractive index varies in the radial direction is employed. The fabrication process is the same as that used in the second embodiment.

The difference in fabrication process is that the refractive index of the liquid mixture is adjusted in accordance with the graded-index-type optical fiber. This enables formation of an optical waveguide at the tip end of the graded-index-type optical fiber.

Figure 6:
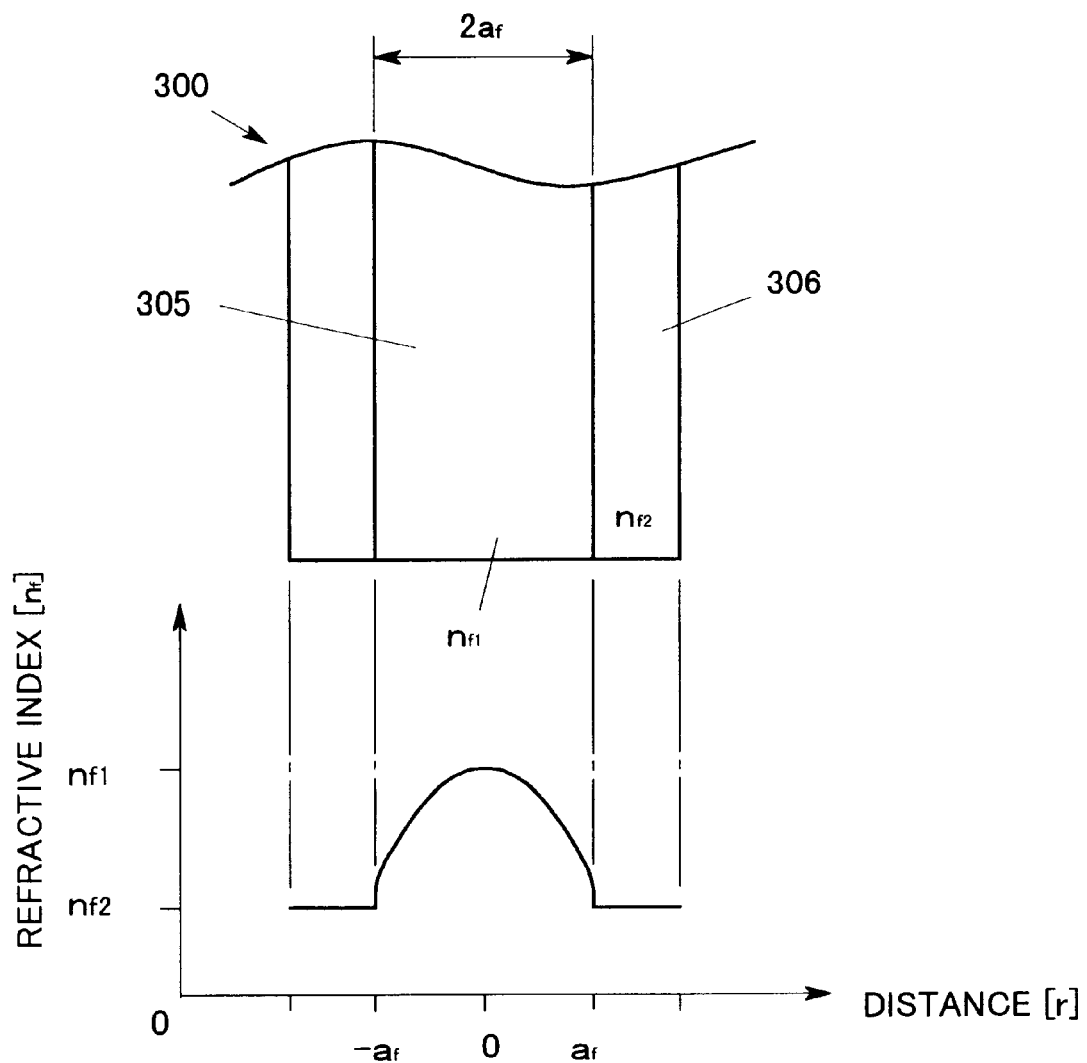
FIG. 6 is an explanatory view in relation to a third embodiment showing index distribution within an optical fiber.

Since the fabrication steps are the same as those of the second embodiment, their descriptions are omitted, and only the method of determining the refractive index of the liquid mixture will be described. FIG. 6 shows a cross section of a graded-index-type optical fiber 300 taken along the optical axis, as well as a graph showing variation in refractive index in the radial direction. The horizontal axis represents distance in the radial direction, and the vertical axis represents refractive index.

The graded-index-type optical fiber 300 is formed of a core portion 305 and a cladding portion 306 protecting the core portion 305. The refractive index $n_f(r)$ of the core portion 305 is represented by equation (16):

$$(n_f(r))^2 = n_{f1}^2 [1 - 2(r/a_f)^p \cdot \Delta] \Delta = (n_{f1}^2 - n_{f2}^2)/(2n_{f1}^2) \qquad (16)$$

where r is the distance from the center of the core portion 305, $a_f$ is the radius of the core portion 305 of the graded-index-type optical fiber 300, $n_{f1}$ is the maximum refractive index at the center of the core portion 305, $n_{f2}$ is the refractive index of the cladding portion 306, and p is an integer representing the type of distribution (variation). The equation (16) has been well known as, e.g., equations (7.1) and (7.12) of Introduction to Optical Fiber Transmission (written by Yasuharu SUEMATSU and Kenichi IGA, published by Ohmsha, Ltd., 1976), page 117–123. The equation (16) satisfies the formula $n_f(0)=n_{f1}$ where r=0, and $n_f(a_f)=n_{f2}$ where r=$a_f$. For example, p=2. Here $\Delta$ represents specific refraction difference.

When equation (16) is modified so as to obtain the radius r as a function of refractive index $n_f$, the following equation (17) is obtained:

$$r(n_f) = a_f [1/(2\Delta) \cdot (n_{f1}^2 - n_f^2)/n_{f1}^2]^{1/p} \Delta = (n_{f1}^2 - n_{f2}^2)/(2n_{f1}^2) \qquad (17)$$

Figure 7:
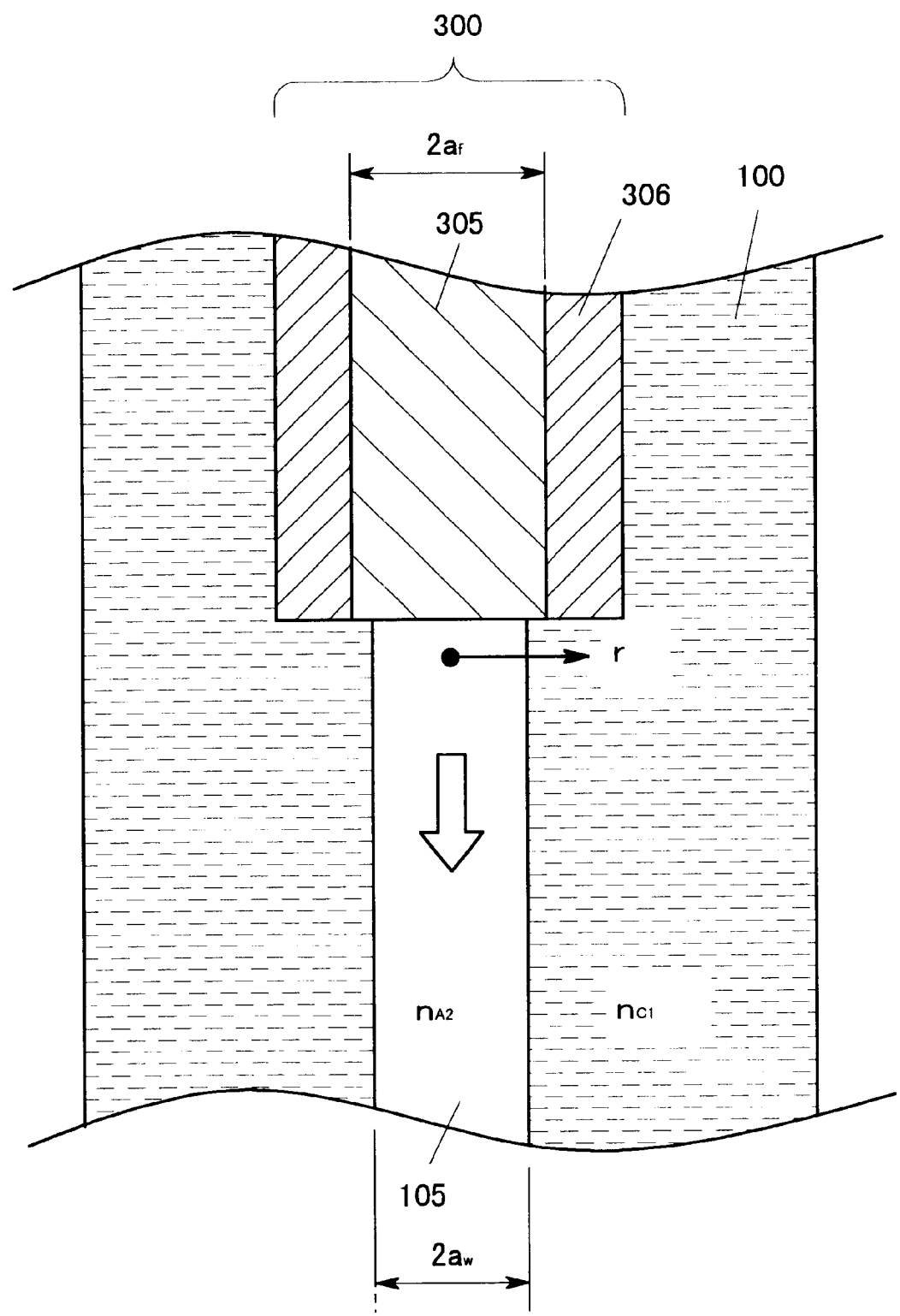
FIG. 7 is a view in relation to the third embodiment showing the relationship between the core diameter of an optical fiber and that of the optical waveguide structure.

The above-described equation holds at the interface between the graded-index-type optical fiber 300 and the liquid mixture 100. FIG. 7 is an enlarged view showing the interface and neighboring portions.

As shown in FIG. 7, the radius of the core portion 105 at the interface is represented by $a_w$, the refractive index at that point becomes $n_{C1}$ (boundary condition with respect to the radial direction). Therefore, $r(n_{C1})=a_w$. Because equation (17) represents a ratio of specific refraction difference $\Delta$ of an optical fiber and an arbitrary refraction difference of the optic fiber, or a specific refraction difference given by $n_{f1}$ and $n_f$, radius $a_w$ of optical waveguide, which is connected to the optical fiber, can be obtained by substituting the specific refraction difference of the optical waveguide for the arbitrary refraction difference as shown by equation (18).

$$a_w = a_f [1/(2\Delta) \cdot (n_{A2}^2 - n_{c1}^2)/n_{A2}^2]^{1/p} \Delta = (n_{f1}^2 - n_{f2}^2)/(2n_{f1}^2) \qquad (18)$$

where $n_{A2}$ is the refraction index of the formed core portion 105.

When the radius $a_w$ of the core portion 105 is determined from the boundary condition, the refractive index $n_{c1}$ of the liquid mixture 100 can be determined.

In an exemplary case in which $n_{f1}=1.46$, $n_{f2}=1.44$, $a_f=50$ $\mu$m, $a_w=24.9$ $\mu$m, $n_{A2}=1.49$, and p=2, the refractive index $n_{c1}$ of the liquid mixture becomes 1.485. This refractive index is realized through adjustment of the refractive indexes $n_{A1}$ and $n_{A2}$ and contents (wt. %) of liquids A and B.

The above-described adjustment enables extraction of a light beam-which propagates straight in the vicinity of the optical axis of the core portion 305 of the graded-index-type optical fiber 300—while its cross section is reduced. Accordingly, the light beam output from the core portion 305 propagates straighter, so that the core portion 105 of a step-index-type optical waveguide structure can be formed in the liquid mixture 100.

Figure 8:
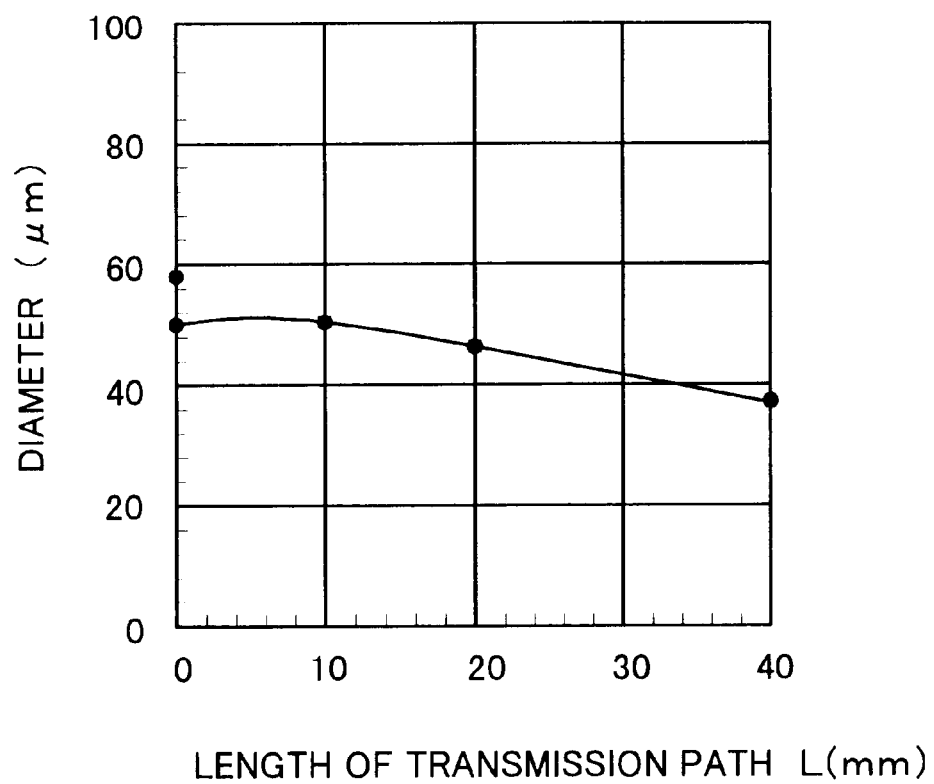
FIG. 8 is a view showing the relationship between the core diameter and core length of the optical waveguide structure according to the third embodiment.

FIG. 8 shows the relationship between the diameter and length of the core portion 105 of the optical waveguide structure fabricated by use of the liquid mixture 100 adjusted in accordance with the above-described equations. The horizontal axis represents waveguide length, and the vertical axis represents diameter ($2a_w$). The waveguide length reaches about 40 mm. Further, the diameter is maintained substantially constant within a range of waveguide length between 0 to 10 mm.

As described above, in the present embodiment, the refractive index of the liquid mixture is determined in consideration of the refractive index of a graded-index-type optical fiber to be used. This enables the core portion of the optical waveguide structure to extend straight from the core portion 305, without being tapered.

Accordingly, the method of fabricating an optical waveguide according to the present embodiment can be advantageously applied to graded-index-type optical fibers used for high-speed communications.

Further, the fabrication method of the present embodiment enables fabrication of an optical waveguide structure which can be coupled with other optical elements without generation of loss.

Fourth Embodiment

In the second and third embodiments, a straight-extending core portion of an optical waveguide structure is realized by use of a mixture of two types of photo-curable liquid resins. However, the core portion may be formed through use of a single type of photo-curable liquid resin and a single kind of light, and the cladding portion may be formed by use of different means. Alternatively, when an inert gas is used as a medium surrounding the core portion for extending lifetime, formation of the cladding layer may be omitted. Therefore, in the present embodiment, the term "core portion" has the same meaning as that of the term "optical waveguide structure."

When a step-index-type optical fiber is used, a single type of photo-curable liquid resin whose refractive index $n_{c1}$ satisfies the above-described equation (11) is used. The fabrication steps are the same as those used in the second embodiment, except for the final step shown in FIG. 3D. Since the refractive index $n_{C1}$ of the photo-curable liquid resin is adjusted so as to satisfy the above-described equation (11), a straight optical waveguide structure having a diameter substantially equal to that of the core portion of the step-index-type optical fiber is formed in the photo-curable liquid resin by means of the mechanism described in the second embodiment.

When a graded-index-type optical fiber is used, a single type of photo-curable liquid resin whose refractive index $n_{C1}$ satisfies the above-described equation (18) is used. The fabrication steps are the same as those used in the second embodiment, except for the final step shown in FIG.3D. Since the refractive index $n_{C1}$ of the photo-curable liquid resin is adjusted so as to satisfy the above-described equation (18), a straight optical waveguide structure having a diameter smaller than of the core portion of the graded-index-type optical fiber is formed in the photo-curable liquid resin by means of the mechanism described in the third embodiment.

Since these optical waveguide structures are small in diameter and are flexible, they can be coupled directly to a light-emitting portion of a LED element or a semiconductor laser element formed on a semiconductor substrate.

Accordingly, the fabrication method of the present embodiment enables an optical waveguide structure to be flexibly disposed on other optical elements.

When a liquid whose refractive index increases after curing and satisfies equation (11) or (18), a single type of photo-curable liquid resin may be used, as described above. However, there may be used a mixture of a first photo-curable liquid resin which cures upon irradiation of light of a certain wavelength and a photo-curable liquid resin whose refractive index is lower than the first photo-curable liquid resin and which does not cure upon irradiation of light of the certain wavelength. In this case, the difference between the refractive index of the core portion after curing and that of the liquid mixture can be made greater, so that the refractive index $n_{C1}$ of the mixture of the photo-curable liquid resins can be easily set so as to satisfy equation (11) or (18). Thus, it becomes possible to easily form a core portion whose radius does not increase and which is therefore excellent in terms of straightness and uniformity of diameter.

Although the above-described optical waveguide structures have no cladding portion, if necessary, a cladding portion may be formed around the optical waveguide structure in the following manner.

A photo-curable liquid resin whose refractive index $n_{C1}$ satisfies equation (11) or (18) is selected in accordance with an optical fiber to be used. Thus, the thus-selected photo-curable liquid resin is used as a first photo-curable liquid resin in order to form a straight optical waveguide structure at the tip end of the optical fiber through curing of the first photo-curable liquid resin. Subsequently, the cured portion of the first photo-curable liquid resin is cleaned (to wash away the un-cured portion) and is dipped into a second photo-curable liquid resin. If necessary, the second photo-curable liquid resin may be cured. Thus, a cladding portion of a blocked shape similar to that in the second and third embodiments is formed.

Further, without the second photo-curable liquid resin being cured, the optical waveguide may be removed from the second photo-curable liquid resin and left without cleaning, such that a portion of the second photo-curable liquid resin remaining on the surface cures. In this case, a flexible optical waveguide structure having a small cladding diameter is formed.

The cladding portion is not required to undergo complete curing. That is, the cladding portion may be in a gel state or liquid state. Moreover, a gas such as air may be used to form a cladding portion. The cladding portion may assume any of various configurations in accordance with various applications, insofar as the refractive index of the optical waveguide is greater than that of the surrounding medium.

Modifications

Although embodiments of the present invention have been described, the embodiments may be modified in various manners. In the first embodiment, a helium-cadmium laser ($\lambda$=325 nm) is used as a short-wavelength laser. However, alternatively, an argon-ion laser ($\lambda$=488 nm) or an extra-high-pressure mercury lamp ($\lambda$=380 nm) may be used in accordance with the types of photo-curable liquid resins to be used.

In the first through third embodiments, the liquid mixture contains an epoxy photo-curable liquid resin having a higher refractive index (e.g., 1.49) and an acrylic photo-curable liquid resin having a lower refractive index (e.g., 1.34). However, other materials may be used, insofar as two types of materials to be used have different curing initiation wavelengths and different refractive indexes after curing. For example, a fluorine monomer or a silicon resin containing a photopolymerization initiator may be used. That is, materials that satisfy the above-described requirements in relation to spectral sensitivity and refractive index may be used.

Further, although in the first through third embodiments, the photo-curable liquid resins are used singly as of each type of the materials, two or more of the photo-curable liquid resins may be alternatively in combination.

In the above-described embodiments, a step-index-type optical fiber and a graded-index-type optical fiber are used. However, other types of fibers such as polarization-maintaining fiber and single-mode fiber may be used.

What is claimed is:

1. A method of fabricating an optical waveguide structure in which light of a predetermined wavelength is introduced into a photo-curable liquid resin in order to cure said photo-curable liquid resin along an optical axis to thereby form an optical waveguide continuing from an area through which said light is introduced, wherein said photo-curable liquid resin is a liquid mixture of a first photo-curable liquid resin and a second photo-curable liquid resin having a curing initiation wavelength shorter than that of said first photo-curable liquid resin; and said method comprises:

radiating a beam of light of a wavelength band capable of curing only said first photo-curable liquid resin into said liquid mixture so as to form a core portion having a rod-like shape; and radiating light of a wavelength band capable of curing both said first and second photo-curable liquid resins into said liquid mixture from an area surrounding said liquid mixture so as to form a cladding portion surrounding said core portion, said core portion having a refractive index greater than that of said cladding portion.

2. A method of fabricating an optical waveguide structure according to claim 1, wherein a refractive index of said first photo-curable liquid resin after curing is greater than a refractive index of said liquid mixture.

3. A method of fabricating an optical waveguide structure according to claim 2, wherein said beam of light having said predetermined wavelength is radiated from a tip end of an optical fiber dipped into said liquid mixture, and said optical waveguide structure is formed so as to be continuous from said tip end of said optical fiber.

4. A method of fabricating an optical waveguide structure according to claim 3, wherein said optical fiber is a step-index-type optical fiber whose refractive index changes stepwise at a boundary between a core portion and a cladding portion; and said refractive index $n_{C1}$ of said liquid mixture is adjusted so as to satisfy a following conditional equation (1):

$$n_{f1}^2 - n_{f2}^2 \leq n_{A2}^2 - n_{C1}^2 \qquad (1)$$

where $n_{f1}$ is a refractive index of said core portion of said optical fiber, $n_{f2}$ is a refractive index of said cladding portion of said optical fiber, and $n_{A2}$ is said refractive index of said cured core portion of said optical waveguide structure.

5. A method of fabricating an optical waveguide structure according to claim 3, wherein said optical fiber is a graded-index-type optical fiber whose refractive index is graded in a radial direction in accordance with a predetermined function; and said refractive index $n_{c1}$ of said liquid mixture is adjusted such that a diameter $2a_w$ of said core portion of said formed optical waveguide structure satisfies a following conditional equation (2):

$$2a_w = 2a_f [1/(2\Delta) \cdot (n_{A2}^2 - n_{c1}^2)/n_{A2}^2]^{1/p} \qquad (2)$$

where $\Delta = (n_{f1}^2 - n_{f2}^2)/2n_{f1}^2$, $n_{f1}$ is a maximum refractive index of a core portion of said optical fiber, $2a_f$ is a diameter of said core portion of said optical fiber, $n_{f2}$ is a refractive index of a cladding portion of said optical fiber, $n_{A2}$ is said refractive index of said cured core portion of said optical waveguide structure, and p is an integer.

6. A method of fabricating an optical waveguide structure according to claim 1, wherein said beam of light having said predetermined wavelength is radiated from a tip end of an optical fiber dipped into said liquid mixture, and said optical waveguide structure is formed so as to be continuous from said tip end of said optical fiber.

7. A method of fabricating an optical waveguide structure according to claim 6, wherein said optical fiber is a step-index-type optical fiber whose refractive index changes stepwise at a boundary between a core portion and a cladding portion; and a refractive index $n_{C1}$ of said liquid mixture is adjusted so as to satisfy a following conditional equation (1):

$$n_{f1}^2 - n_{f2}^2 \leq n_{A2}^2 - n_{C1}^2 \qquad (1)$$

where $n_{f1}$ is a refractive index of said core portion of said optical fiber, $n_{f2}$ is a refractive index of said cladding portion of said optical fiber, and $n_{A2}$ is said refractive index of said cured core portion of said optical waveguide structure.

8. A method of fabricating an optical waveguide structure according to claim 6, wherein said optical fiber is a graded-index-type optical fiber whose refractive index is graded in a radial direction in accordance with a predetermined function; and a refractive index $n_{C1}$ of said liquid mixture is adjusted such that a diameter $2a_w$ of said core portion of said formed optical waveguide structure satisfies a following conditional equation (2):

$$2a_w = 2a_f [1/(2\Delta) \cdot (n_{A2}^2 - n_{c1}^2)/n_{A2}^2]^{1/p} \qquad (2)$$

where $\Delta = (n_{f1}^2 - n_{f2}^2)/(2n_{f1}^2)$, $n_{f1}$ is a maximum refractive index of a core portion of said optical fiber, $2a_f$ is a diameter of said core portion of said optical fiber, $n_{f2}$ is a refractive index of a cladding portion of said optical fiber, $n_{A2}$ is said refractive index of said cured core portion of said optical waveguide structure, and p is an integer.

9. The method of claim 1, wherein said liquid mixture is in a container, and said step of radiating said beam of light is performed so as to form said core portion until said core portion reaches a bottom surface of said container.

10. A method of fabricating an optical waveguide structure comprising:

determining a refractive index of a core portion of an optical fiber;

determining a refractive index of a cladding portion of said optical fiber;

determining a refractive index of a photo-curable liquid resin before curing and a refractive index of said photo-curable liquid resin after curing;

selecting said photo-curable liquid resin based on a conditional equation that is satisfied by said refractive index of said core portion, said refractive index of said cladding portion, said refractive index of said photo-curable liquid resin before curing, and said refractive index of said photo-curable liquid resin after curing;

dipping a tip end of said optical fiber into said photo-curable liquid resin; and radiating a light of a predetermined wavelength from said tip end in order to cure said photo-curable liquid resin along an optical axis to thereby form an optical waveguide continuing from said tip end of said optical fiber, wherein said optical fiber is a step-index-type optical fiber whose refractive index changes stepwise at a boundary between a core portion and a cladding portion, wherein said refractive index $n_{C1}$ of said photo-curable liquid resin before curing is adjusted so as to satisfy said conditional equation:

$$n_{f1}^2 - n_{f2}^2 \leq n_{A2}^2 - n_{C1}^2$$

where $n_{f1}$ is said refractive index of said core portion of said optical fiber, $n_{f2}$ is said refractive index of said cladding portion of said optical fiber, and $n_{A2}$ is said refractive index of said photo-curable liquid resin after curing.

11. The method of claim 10, wherein said photo-curable liquid resin is in a container, and said light is radiated to form said optical waveguide until said waveguide reaches a bottom surface of said container.

12. The method of claim 11, further comprising the step of radiating a second light of a wavelength different from said predetermined wavelength so as to form a cladding portion around said waveguide,
   wherein the photo-curable liquid resin is a liquid mixture of a plurality of types of photo-curable liquid resins, and one photo-curable liquid resin of said liquid mixture is cured as said optical waveguide.

13. A method of fabricating an optical waveguide structure comprising:
   determining a refractive index of a core portion of an optical fiber;
   determining a refractive index of a cladding portion of said optical fiber;
   determining a refractive index of a photo-curable liquid resin before curing and a refractive index of said photo-curable liquid resin after curing;
   selecting said photo-curable liquid resin based on a conditional equation that is satisfied by said refractive index of said core portion, said refractive index of said cladding portion, said refractive index of said photo-curable liquid resin before curing, and said refractive index of said photo-curable liquid resin after curing;
   dipping a tip end of said optical fiber into said photo-curable liquid resin;
   radiating light of a predetermined wavelength from said tip end in order to cure said photo-curable liquid resin along an optical axis to thereby form an optical waveguide continuing from said tip end of said optical fiber, wherein said optical fiber is a graded-index-type optical fiber whose refractive index is graded in a radial direction in accordance with a predetermined function,
   wherein refractive index $n_{C1}$ of said photo-curable liquid resin before curing is adjusted such that a diameter $2a_w$ of said formed optical waveguide satisfies said conditional equation:

$$2a_w = 2a_f [1/(2\Delta) \cdot (n_{A2}^2 - n_{C1}^2)/n_{A2}^2]^{1/p}$$

where $\Delta = (n_{f1}^2 - n_{f2}^2)/(2n_{f1}^2)$, $n_{f1}$ is a maximum refractive index of said core portion of said optical fiber, $2a_f$ is a diameter of said core portion, $n_{f2}$ is said refractive index of said cladding portion of said optical fiber, $n_{A2}$ is said refractive index of said photo-curable liquid resin after curing, and p is an integer.

14. The method of claim 13, wherein said photo-curable liquid resin is in a container, and said light is radiated to form said optical waveguide until said waveguide reaches a bottom surface of said container.

15. The method of claim 14, further comprising the step of radiating a second light of a wavelength different from said predetermined wavelength so as to form a cladding portion around said waveguide,
   wherein the photo-curable liquid resin is a liquid mixture of a plurality of types of photo-curable liquid resins, and one photo-curable liquid resin of said liquid mixture is cured as said optical waveguide.

16. A method of fabricating an optical waveguide structure comprising:
   dipping a tip end of an optical fiber into a liquid mixture of a plurality of types of photo-curable liquid resins, and
   radiating a light of a predetermined wavelength from said tip end in order to selectively cure only a single type photo-curable liquid resin of said liquid mixture along an optical axis to thereby form the optical waveguide continuing from said tip end of said optical fiber,
   wherein said optical fiber is a step-index-type optical fiber whose refractive index changes stepwise at a boundary between a core portion and a cladding portion; and a refractive index $n_{C1}$ of said liquid mixture is determined to satisfy a following conditional equation:

$$n_{f1}^2 - n_{f2}^2 \leq n_{A2}^2 - n_{C1}^2$$

where $n_{f1}$ is a refractive index of said core portion of said optical fiber, $n_{f2}$ is a refractive index of said cladding portion of said optical fiber, and $n_{A2}$ is a refractive index of said optical waveguide.

17. The method of claim 16, wherein said liquid mixture is in a container, and said light is radiated to form said optical waveguide until said waveguide reaches a bottom surface of said container.

18. The method of claim 17, further comprising the step of radiating a second light of a wavelength different from said predetermined wavelength to form a cladding portion around said waveguide by curing the remaining photo-curable liquid resins of said liquid mixture.

19. A method of fabricating an optical waveguide structure comprising:
   dipping a tip end of an optical fiber into a liquid mixture of a plurality of types of photo-curable liquid resins, and
   radiating light of a predetermined wavelength from said tip end in order to selectively cure only a single type photo-curable liquid resin of said liquid mixture along an optical axis to thereby form an optical waveguide continuing from said tip end of said optical fiber,
   wherein said optical fiber is a graded-index-type optical fiber whose refractive index is graded in a radial direction in accordance with a predetermined function; and a refractive index $n_{C1}$ of said liquid mixture is determined such that a diameter $2a_w$ of said formed optical waveguide satisfies a following conditional equation:

$$2a_w = 2a_f [1/(2\Delta) \cdot (n_{A2}^2 - n_{C1}^2)/n_{A2}^2]^{1/p}$$

where $\Delta = (n_{f1}^2 - n_{f2}^2)/(2n_{f1}^2)$, $n_{f1}$ is a maximum refractive index of a core portion of said optical fiber, $2a_f$ is a diameter of said core portion, $n_{f2}$ is a refractive index of a cladding portion of said optical fiber, $n_{A2}$ is a refractive index of said optical waveguide, and p is an integer.

20. The method of claim 19, wherein said liquid mixture is in a container, and said light is radiated to form said optical wavelength until said waveguide reaches a bottom surface of said container.

21. The method of claim 20, further comprising the step of radiating a second light of a wavelength different from said predetermined wavelength to form a cladding portion around said waveguide by curing the remaining photo-curable liquid resins of said liquid mixture.

22. A method of fabricating an optical waveguide structure in which light of a predetermined wavelength is introduced into a photo-curable liquid resin in order to cure said photo-curable liquid resin along an optical axis to thereby form an optical waveguide continuing from an area through which said light is introduced, wherein said photo-curable liquid resin is a liquid mixture of a first photo-curable liquid resin and a second photo-curable liquid resin having a curing initiation wavelength shorter than that of said first photo-curable liquid resin and having a refractive index smaller than that of said first photo-curable liquid resin; and said method comprises:

radiating a beam of light of a wavelength band capable of curing only said first photo-curable liquid resin into said liquid mixture so as to form a core portion having a rod-like shape.

* * * * *